United States Patent
Hsiao

[11] Patent Number: 5,968,842
[45] Date of Patent: Oct. 19, 1999

[54] TECHNIQUES FOR REDUCED DISHING IN CHEMICAL MECHANICAL POLISHING

[75] Inventor: Chih-Hsiang Hsiao, Taipei, Taiwan

[73] Assignee: United Semiconductor Corp., Taiwan

[21] Appl. No.: 08/975,487

[22] Filed: Nov. 21, 1997

Related U.S. Application Data

[60] Provisional application No. 60/058,681, Sep. 12, 1997.

[51] Int. Cl.$^6$ .................................................. H01L 21/304
[52] U.S. Cl. ........................ 438/692; 438/689; 438/691; 438/633
[58] Field of Search .................................... 438/691, 692, 438/690, 633

[56] References Cited

U.S. PATENT DOCUMENTS

| | | | |
|---|---|---|---|
| 5,441,094 | 8/1995 | Pasch | 438/690 |
| 5,629,242 | 5/1997 | Nagashima et al. | 438/692 |
| 5,804,492 | 9/1998 | Shen | 438/696 |

*Primary Examiner*—Benjamin Utech
*Assistant Examiner*—Kin-Chan Chen
*Attorney, Agent, or Firm*—Rabin & Champagne, P.C.

[57] ABSTRACT

A shallow trench isolation structure is formed by providing a polish stop layer with an opening aligned with edges of a trench formed in the substrate. The etch stop layer might have a surface composition of $SiO_xN_y$ and a composition of SiN or $Si_3N_4$ at a lower surface within the polish stop layer. The composition of the silicon oxynitride surface of the polish stop layer is most preferably chosen so that the material has a refractive index on the order of n~1.8 to 2.0. The trench is overfilled with silicon oxide so that a layer of silicon oxide extends over the surface of the etch stop layer. Chemical mechanical polishing is then performed to remove the excess silicon oxide from the surface of the etch stop layer and to define an oxide plug within the trench. When the polishing process reaches the surface of the etch stop layer, there is a reduced tendency for the polishing pad to remove material preferentially from the oxide plug because the surface of the polish stop layer is more similar in terms of polishing characteristics to the plug material than in more conventional trench polishing processes. After polishing, the polish stop layer is removed to complete definition of the shallow trench isolation structure.

16 Claims, 4 Drawing Sheets

TECHNIQUES FOR REDUCED DISHING IN CHEMICAL MECHANICAL POLISHING

This application claims benefit of Provisional Appl. 60/058,681 filed on Sep. 12, 1997.

BACKGROUND OF THE INVENTION

1. Field of the Invention

The present invention relates to the provision of device isolation structures between devices of an integrated circuit formed in and on a semiconductor substrate and to the use of chemical mechanical polishing techniques in the formation of shallow trench isolation structures.

2. Description of the Related Art

A variety of integrated circuits incorporate device isolation structures between adjacent semiconductor devices to prevent carriers from traveling through the substrate between the adjacent devices. For example, device isolation structures are conventionally formed between adjacent field effect transistors (FETs) in dense semiconductor circuits such as dynamic random access memories (DRAMs) to reduce charge leakage to and from the charge storage nodes of the FETs. Often, device isolation structures take the form of thick field oxide regions extending below the surface of the semiconductor substrate. The most common early technique for forming a field oxide region is the local oxidation of silicon ("LOCOS") technique. The LOCOS technique, including the various modified LOCOS procedures that have been introduced over the years, have provided effective device isolation at a relatively low cost and with an acceptable level of reliability. The LOCOS technique has various drawbacks, however, including its well known problems related to stress generation and the thin "bird's beak" region formed at the periphery of the LOCOS field isolation structure. Particularly because of the bird's beak problem, the LOCOS field isolation structure is difficult to implement effectively for small device geometries and so must be replaced in high density devices by a more readily scaled device isolation region.

Shallow trench isolation ("STI") has become a prevalent strategy for device isolation. In STI, a sharply defined trench is formed in the semiconductor substrate by anisotropic etching, sometimes using a silicon nitride hard mask much like the mask used for LOCOS processing. The trench is then filled with oxide to provide a device isolation region having an upper surface near or at the original substrate surface. After formation of the shallow trench isolation structure, devices are provided in and on the P-type surface of the typical silicon substrate. One or more FET devices might be formed adjacent the sides of the STI structure, with each FET including a pair of N-type source/drain regions on either side of a channel region of the FET and a polysilicon gate electrode separated from the corresponding channel region by a gate oxide layer. The shallow trench isolation structure separates the source/drain regions of the FET device from other doped regions in adjacent regions of the substrate. Shallow trench isolation structures provide effective isolation across their entire width and are readily scaled to small device geometries. In this regard, shallow trench isolation structures are unlike LOCOS isolation regions, which must accommodate the characteristic LOCOS bird's beak structures on either side of the LOCOS isolation region and so do not provide effective device isolation over their entire width. In addition, the techniques typically used to form shallow trench isolation structures naturally produce a substantially planarized surface over the isolation structure, which is advantageous for almost all subsequent steps in the process flow. Formation of a shallow trench isolation structure is now discussed in greater detail with reference to FIGS. 1–4.

FIG. 1 illustrates an early stage in the formation of an integrated circuit device and illustrates a small portion of the device substrate where a shallow trench isolation structure is to be formed. Silicon substrate 10 is coated with a layer of silicon nitride 12, for example by chemical vapor deposition (CVD), which will be used as a polish stop layer for a chemical mechanical polishing process used in forming the shallow trench isolation structure. Next, a trench definition mask 14 is formed by spinning on and curing a layer of photoresist on the silicon nitride layer 12 and then exposing and selectively removing the photoresist layer to form an opening 16 in the photoresist mask 14. A trench is formed in the substrate by etching through the silicon nitride layer 12 and then etching a trench 18 into the silicon substrate 10 (FIG. 2). As is illustrated, the etching processes used to etch through the silicon nitride layer 12 and to open the trench tend to erode the photoresist mask during the etching process so that the trench produced in this process has slightly sloped sidewalls. The trench etching mask 14 is then removed.

Next, the trench 18 is filled with a layer of silicon oxide 20, for example, by atmospheric pressure chemical vapor deposition (APCVD) using tetraethylorthosiloxane (TEOS) as a source gas. The trench is conventionally overfilled during deposition, as shown in FIG. 3, because TEOS oxide typically requires a densification process and the TEOS oxide layer shrinks during densification. Densification of the TEOS oxide is accomplished at a temperature of approximately 1000° C. for a time period of about 10–30 minutes. After densification, the portion of the TEOS oxide layer extending above the silicon nitride layer 12 is removed by chemical mechanical polishing using the silicon nitride layer 12 as a stop for the polishing process, leaving an oxide plug 22 in the trench region (FIG. 4).

As shown in FIG. 4, the surface of the oxide plug 22 is typically recessed below the surface of the silicon nitride polish stop layer 12, as indicated by 24 in FIG. 4, during chemical mechanical polishing because the oxide plug is softer and polishes more rapidly than the silicon nitride layer. The silicon nitride layer 12 is next removed from over the substrate, typically leaving a portion of the oxide plug 22 extending above the surface of the substrate. A hydrofluoric acid dip is used to remove a thickness of the oxide plug 22 and to clean the surface of the substrate 10. Often, the oxide etching and other processing steps (not illustrated) can cause a sufficient amount of the plug oxide 22 to be etched so that the surface of the plug oxide is recessed below the surface of the substrate 10. The overetching condition may be most pronounced at the edges of the oxide plug 34 immediately adjacent the surface of the substrate 10, or the entire surface of the oxide plug may be recessed substantially uniformly below the surface of the substrate. In either case, overetching may cause a "shoulder" portion of the substrate to be exposed and partially etched at the side wall of the trench, or only a thin layer of oxide may cover the substrate adjacent the side wall of the trench.

After the plug oxide is defined within the shallow trench isolation structure, a gate oxide layer is next grown thermally over the exposed active device surfaces of the substrate. As a practical matter, the gate oxide layer often is of poor quality with a convex profile at the "shoulder" region of the substrate at the edge the trench of the shallow trench isolation structure. Subsequent formation of gate electrodes and wiring lines that extend over the edges of the trenches are then separated from the substrate at the edge of the trench by an oxide layer that has poor insulating properties. The poor qualities of the oxide layer may mediate a coupling between the gate electrodes or wiring lines and the substrate covered by the poor quality oxide layer formed over the trench shoulder regions. This undesirable coupling may be sufficient to allow for parasitic MOSFET action at the shoulder region, with the wiring line 44 acting as part of the gate of the parasitic MOSFET and signals on the wiring line controlling action of the parasitic MOSFET. The formation of parasitic MOSFETs or other forms of electrical coupling between the wiring line and the substrate can reduce the turn-on threshold voltage of the transistor channel and can produce the abnormal subthreshold current associated with the "kink" effect. Occurrence of the kink effect impairs device and circuit performance and is consequently undesirable.

SUMMARY OF THE PREFERRED EMBODIMENTS

It is accordingly an object of the present invention to provide a chemical mechanical polishing process which achieves better planarization of surfaces. More particularly, it is an object of the present invention to provide a chemical mechanical polishing process which produces a reduced level of dishing when applied to the formation of shallow trench isolation structures.

According to an aspect of the present invention forms an integrated circuit device including shallow trench isolation structures, by providing a substrate having an trench extending into a surface of the substrate, the trench having upper edges at the surface of the substrate. A polish stop layer is provided over the substrate, with the polish stop layer having an opening corresponding to the upper edges of the trench in the substrate. A layer of trench fill material is provided over the polish stop layer to a sufficient thickness to fill the trench in the substrate. Polishing removes the layer of trench fill material from over the polish stop layer and defines a plug filling the trench. The polish stop layer has an upper surface and a lower surface, the upper surface having a polishing rate more similar to a polishing rate of the trench fill material than is a polishing rate of the lower surface of the polish stop layer.

According to another aspect of the present invention, an integrated circuit device including shallow trench isolation structures is formed by providing a substrate having an trench extending into a surface of the substrate, the trench having upper edges at the surface of the substrate. A polish stop layer is provided over the substrate, the polish stop layer having an opening corresponding to the upper edges of the trench in the substrate. A layer of trench fill material is provided over the polish stop layer to a sufficient thickness to fill the trench in the substrate, the trench fill material comprising silicon oxide. The layer of trench fill material is polished to define a plug filling the trench. The polish stop layer comprises an oxynitride surface layer and a lower layer, the oxynitride surface layer having an oxynitride polishing rate and the lower layer having a slower polishing rate in an oxide polishing process.

DESCRIPTION OF THE PREFERRED EMBODIMENTS

Particularly preferred embodiments of the present invention provide a polish stop layer for use in a chemical mechanical polishing process in which the polish stop layer has a layered structure or a composition that is graded over at least a portion of the distance from an upper surface of the polish stop layer to a lower surface of the polish stop layer. The upper surface of the polish stop layer is chosen to have a composition more closely matched in polishing characteristics to the material being removed by polishing while the lower surface has a composition less closely matched in polishing characteristics to the material being polished. Such a polish stop layer is particularly useful in polishing processes used to remove excess materials deposited to fill openings or trenches in a surface because there will be a reduced tendency for the polishing pad to deform as the polishing process reaches the surface of the polish stop layer. As such, there will be a reduced tendency to undesirably remove materials from within the openings or trenches, even when the materials that fill the openings or trenches have high polishing rates as compared to the polishing rate of the polish stop layer. This process is well suited to removing excess oxide provided to fill a trench in forming a shallow trench isolation structure.

Figure 1:
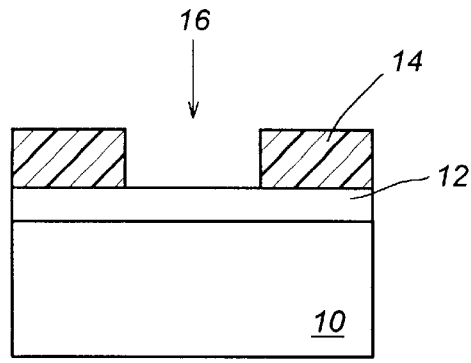
FIGS. 1–4 schematically illustrate processing steps in the conventional formation of a trench isolation structure.
Figure 2:
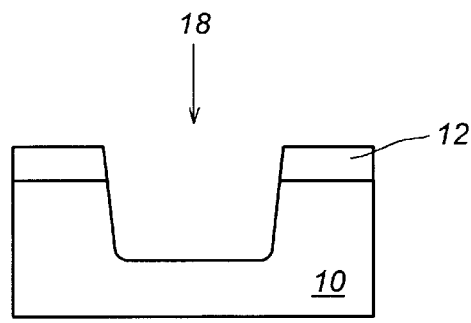
Figure 3:
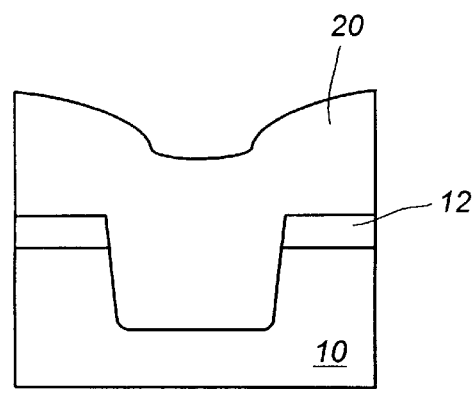
Figure 4:
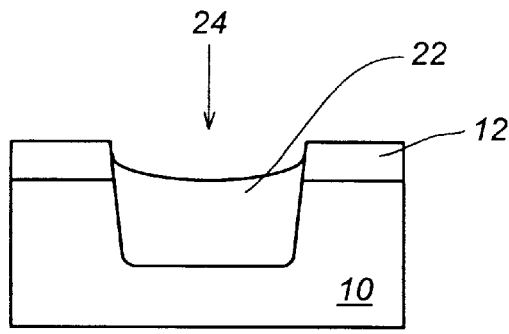

In an exemplary embodiment, the polish stop layer has an opening aligned with edges of a trench formed in a silicon substrate. The trench is overfilled with silicon oxide so that a layer of silicon oxide extends over the surface of the etch stop layer. Typically, the silicon oxide trench fill material will have a nominal composition of $SiO_2$. For this embodiment, the polish stop layer might have a surface composition of $SiO_xN_y$ and a composition of $SiN$ or $Si_3N_4$ at a lower surface within the polish stop layer. Such a structure could be provided by depositing two distinct layers or might be provided by gradually altering the mixture of deposition source gases at a point during the deposition of the etch stop layer. The composition of the silicon oxynitride surface of the polish stop layer is most preferably chosen so that the material has a refractive index on the order of n~1.8 to 2.0. Chemical mechanical polishing is then performed to remove the excess silicon oxide from the surface of the etch stop layer and to define an oxide plug within the trench. When the polishing process reaches the surface of the etch stop layer, there is a reduced tendency for the polishing pad to remove material preferentially from the oxide plug because the surface of the polish stop layer is more similar in terms of polishing characteristics to the plug material than in more conventional trench polishing processes. For both the conventional polishing method and polishing methods in accordance with the present invention, when the polishing process approaches its endpoint, the polishing pad faces reaches a point when it is polishing both the polish stop layer and the oxide plug material. When this occurs using the conventional process, the comparative hardness of the conventional silicon nitride polish stop layer causes the polishing process to remove material preferentially from the oxide plug, introducing the dishing illustrated in FIG. 4. In contrast, when a trench CMP polishing process in accordance with the present invention reaches the preferred silicon oxynitride surface of the polish stop layer, the silicon oxynitride has more similar polishing characteristics to the oxide plug and so the polishing process tends no material and there is a reduced level oxide plug material and there is a reduced level of dishing.

Embodiments of the present invention provide improved planarization adjacent trenches and improved reliability for devices subsequently formed adjacent the trenches. For example, practice of the invention can reduce the frequency with which the "kink effect" occurs and the extent of the kink effect when it does occur. These advantages are particularly relevant when the trench polishing process varies from optimal parameters by a small amount such as when the polishing process continues a short depth beyond the upper surface of the etch stop layer. For such a small variation from the optimal parameters, the polishing process does not proceed beyond the silicon oxynitride portion of the polish stop layer and so there is little dishing associated with the out of range polishing process. Of course, for still more considerable variations from the optimal parameters of the polishing process, the polishing process will extend into the silicon nitride portions of the polish stop layer and dishing will occur. However, since little dishing occurs for the initial portion of the out of range polishing process, the total extent of the dishing will still be lower than in the conventional process.

A further advantage of particularly preferred implementations of the present invention is that, since the composition of the silicon oxynitride layer does not have to be too different from the conventional silicon nitride polish stop layer, relatively few changes need be made in the process to accommodate the additional layer or the graded composition of a polish stop layer in accordance with preferred embodiments of the present invention. For example, the typical dry etching process used to pattern the polish stop layer prior to etching the trench into the substrate can be used for the multi-composition polish stop layer in accordance with the present invention. In addition, both components of the polish stop layer can stripped in a phosphoric acid solution, as is sometimes practiced conventionally after the trench plug is defined.

These and other aspects of preferred embodiments of the present invention are now described in further detail with reference to FIGS. 5–10. Prior to trench formation, it is typical to provide a layer of oxide over the surface of the silicon substrate 30 to act as a pad to protect the silicon substrate from the silicon nitride layer of the polish stop layer. The pad oxide layer can be grown in a thermal oxidation process or could be deposited by chemical vapor deposition (CVD). The thickness of the pad oxide layer 102 is whatever is necessary to protect the substrate during subsequent processing. A pad oxide layer might not be necessary if the polish stop layer were compatible with the substrate through all subsequent processing steps. In practice, however, the lower, silicon nitride portion of the polish stop masking layer stresses the substrate during thermal processing such as TEOS oxide densification. As such, a pad oxide layer is typically desirable to relieve stress that would otherwise be generated between the silicon nitride layer and the substrate during subsequent thermal processing steps.

After the substrate 30 has been prepared for trench formation, a polish stop layer in accordance with the present invention is provided over the surface of the substrate 30. The illustrated embodiment is intended to serve as a polish stop layer used in defining a shallow trench isolation structure in which silicon oxide is used as a trench fill material. As such, the upper portion of the polish stop layer, which might be considered to be a buffer layer within the polish stop layer, should have polishing characteristics relatively similar to the silicon oxide material that will be removed by polishing. The lower portion of the polish stop layer should have characteristics much like the conventional polish stop layer in case the polishing process proceeds far out of its designed range. The present inventors have determined that the silicon oxynitride buffer layer portion of the polish stop layer should have a significant level of oxygen incorporated, but the oxynitride layer does not have to have a high level of oxygen incorporated to have polishing characteristics similar to those exhibited by the silicon oxide trench fill material. One of the most convenient measures for measuring the level of oxygen incorporated into $SiO_xN_y$ is through the refractive index as determined by an optical measurement such as by reflection spectroscopy or by ellipsometry. The inventors have observed that a $SiO_xN_y$ layer that has polishing characteristics appropriate to the practice of the present invention has an index of refraction of between about n=1.8 to 2.0. The index of refraction of $SiO_2$ is about n=1.45, plus or minus a few hundredths. The index of refraction of silicon nitride ($Si_3N_4$) varies over a greater range, but is typically about n=2.1. As such, the compositions represented by an index of refraction variation of from about 1.8 to 2.0 represents anywhere from approximately equal levels of oxygen and nitrogen incorporation to a composition that has a high level of nitrogen incorporation.

Figure 5:
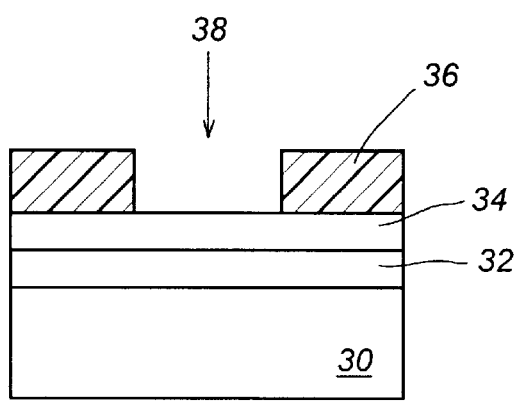
FIGS. 5–10 schematically illustrate processing steps in the formation of a trench isolation structure in accordance with preferred embodiments of the present invention.

The total thickness of the polish stop layer provided in accordance with the present invention can be selected to have a thickness approximately equal to the uniform composition silicon nitride polish stop layer provided in conventional trench CMP processes. The exact thickness of the nitride layer 32 and the oxynitride layer 34 to be provided might, of course, vary depending on the exact processes being used in conjunction with the manufacture of the shallow trench isolation device. The silicon nitride layer 32 might be deposited to a thickness of about 1000 Å in a chemical vapor deposition (CVD) process, followed by the deposition of a silicon oxynitride layer 34 in a similar CVD process to a thickness of about 1000 Å. The deposition of the silicon oxynitride layer after the silicon nitride layer might be accomplished by stopping the deposition process after deposition of the silicon nitride, followed by the reinitiation of a CVD process with a different mixture of source gases. Alternately, the source gas mixture might simply be switched as the CVD growth process continues, which would produce a more graded change in the composition between the successive layers. After the polish stop layers 32, 34 are provided, a layer of photoresist is provided over the polish stop layers and the photoresist is exposed and shaped to form a trench etching mask 36 in the usual manner so that the surface of the buffer layer 34 is exposed at a region 38 above where the trench will be formed by etching. Most often, the photoresist mask 36 is used to define the lateral extent of all of the etching steps used in the formation of the trench in the substrate, because fewer processing steps are involved. FIG. 5 illustrates the device at this stage of processing.

Figure 6:
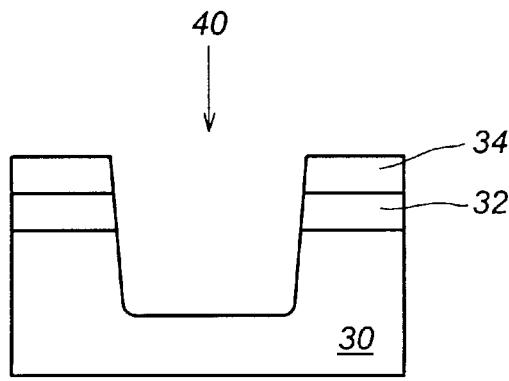

The trench is formed by consecutively etching layers 34 and 32 from the surface of the substrate where exposed by the mask 36, etching the pad oxide layer (not shown), and then etching the substrate 30 to define the trench. The etch processes used are preferably highly anisotropic and may, for example, be performed by reactive ion etching (RIE). For the silicon oxynitride of layer 34 and the silicon nitride preferably used for layer 32, a suitable etchant gas mixture may include a mixture of $SF_6$, He and $O_2$. The pad oxide layer is etched using, for example, a gas mixture consisting of $CHF_3$, $O_2$ and Ar. The trench is etched into the silicon substrate using RIE and a mixture of gases including $Cl_2$, He, HBr and $O_2$, with the lowest portion of the trench being etched using $SF_6$ so that the trench has rounded edges at its bottom. An appropriate trench 40 for forming a shallow trench isolation is illustrated in FIG. 6 and may be approximately 4000–6000 Å deep and more preferably about 4,500 Å deep. If desired, a thin thermal oxide layer may be grown on the sidewalls and bottom of the trench to remove defects created by the etching process. If such a thin oxide layer is formed, the layer can either be left in place, becoming part of the trench plug, or the thin oxide layer may be removed.

Figure 7:
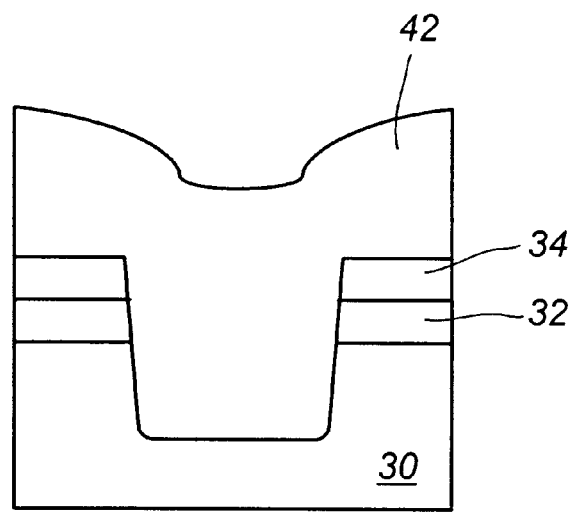

A thick layer of insulation material 42 is then deposited, as shown in FIG. 7, preferably to fill the trench region and to provide a surface on which other material can be deposited. Most often, a thick oxide layer is deposited using the ozone TEOS or CVD TEOS processes. Conventional CVD techniques, including atmospheric pressure CVD (APCVD), LPCVD and plasma enhanced CVD (PECVD), can be successfully used for forming the type of conformal oxide layer often preferred as the plug material within the trench. When a TEOS oxide is used as the layer 42, it is preferred that the TEOS layer be deposited to a thickness of approximately 8,000 Å. Overfilling the trench region with a TEOS oxide layer is preferred because the TEOS layer shrinks by approximately 6% during densification. The TEOS oxide layer 42 is then densified at a temperature of approximately 1000° C. for a period of between 10 to 30 minutes.

Figure 8:
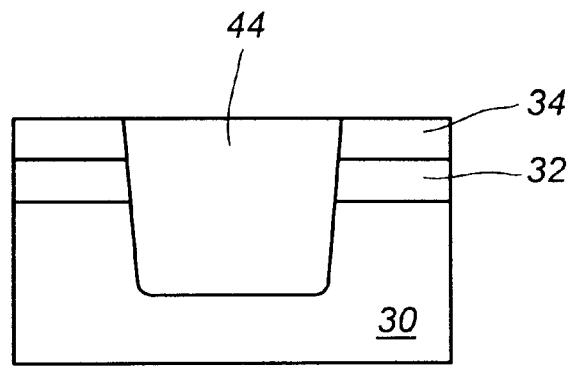
Figure 9:
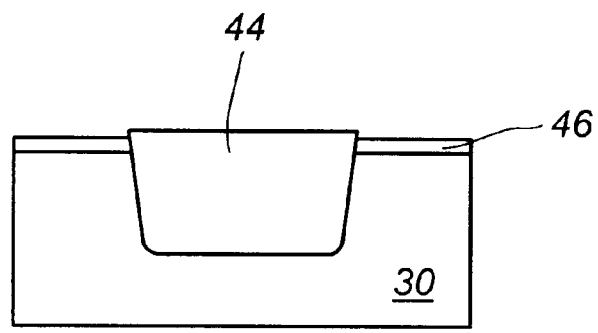

For the preferred embodiments in which layer 42 is a TEOS oxide layer or another type of oxide, the process continues by removing the excess portion of the layer 42 which extends over the surface of the substrate 30 in an oxide CMP process. Most preferably this is accomplished in a fixed time polishing process that preferably stops at or not far below the original surface of the buffer polish stop layer 34. FIG. 8 shows the FIG. 7 device after a fixed time CMP process has been used to remove excess portions of oxide layer 42 from the surface of the buffer polish stop layer 34, thereby defining an oxide plug 44 filling the trench and extending above the surface of the silicon substrate 30. By properly selecting the material for the buffer layer 34 so that it has polishing properties similar to the oxide being polished in this oxide polishing process, the surface of the oxide plug 44 should be essentially coplanar with the surface of the buffer polishing layer 34. How similar the polishing properties of the buffer layer need to be to the material being polished will depend on the likelihood and the extent by which the polishing process exceeds its bounds. The more out of range the polishing process is likely to proceed, the closer the match should be between the polishing properties of the buffer polishing layer 34 and the material being polished to define the trench plug. In any case, the buffer layer of the polish stop layer desirably exhibits a polishing rate more similar to the material being polished than to the polishing rate of the material that makes up the base portion of the polish stop layer (e.g., the silicon nitride in the illustrated process), for the particular polishing process used to remove the material being polished.

After the polishing process produces the structure shown in FIG. 8, the polish stop layers 34, 32 are removed. The silicon oxynitride layer 34 and the silicon nitride layer 32 can be removed in a single process step by dipping the device into a solution of $H_3PO_4$ held at a temperature of between about 150–180° C. After the polish stop layers are stripped, the oxide plug 44 will extend above the surface of the substrate 30 by a distance of approximately 1000–2000 Å in the illustrated embodiment. This level of elevation for the oxide plug is undesirable and so further processing is performed to complete the planarization. Because of the more controlled polishing process used to define the oxide plug 44, however, the desired surface level for the oxide plug can be achieved through controlled etching processes.

Typically, the pad oxide layer provided between the polish stop layer and the substrate is stripped in a dilute HF solution, which also removes a portion of the oxide plug 44, as well. The HF dip used to remove the pad oxide layer might therefore be extended by a desired amount of time so that the oxide plug has a desired height above the substrate. It should be recognized that further processing, include further oxide etching steps, will be performed subsequently so that it is not preferred at this time to reduce the height of the oxide plug 44 so that the surface of the plug is coplanar with the surface of the substrate 30.

After layers 34 and 32 are stripped, it is conventional to grow a new protective oxide layer 46 (FIG. 9) to a thickness of 200–300 Å for protecting the surface of the substrate and for limiting the channeling of ions implanted in a subsequent ion implantation step. At this time, well implantations and channel implantations can be made through the protective oxide layer. Preferably, these implantations are activated using rapid thermal anneals (e.g., by heating the device to 1000° C. for a few to tens of seconds) performed at the same time that the subsequent source and drain implantations are activated. The protective oxide layer 46 is then stripped in dilute HF, which removes a further portion of the oxide plug 44. Most preferably, the trench walls remain covered and protected throughout the processing, with the oxide plug 44 extending slightly above the surface of substrate 30 after all shallow trench isolation structure definition processes are complete.

Figure 10:
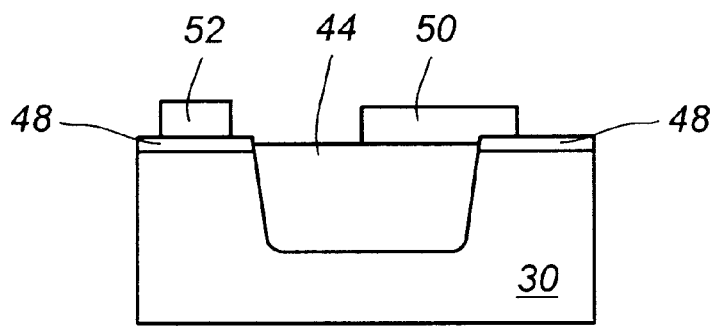

Referring now to FIG. 10, the desired integrated circuit devices are formed on the substrate 30, for example including MOS transistors. To form a MOS transistor, a gate oxide layer 48 may be grown in an oxygen environment at a temperature of 900–1000° C. to a thickness appropriate to the particular MOS transistor being formed, for example, between about 30–200 Å. The lowest level wiring layer is next formed by depositing a layer of wiring material on the device. A layer of polysilicon may be deposited by low pressure chemical vapor deposition (LPCVD) at a substrate temperature of approximately 620° C. to a thickness of between about 2000–3000 Å, as appropriate to the particular device. When the wiring layer comprises polysilicon, the layer is preferably doped by implanting an impurity such as boron or phosphorus that is activated by a later rapid thermal anneal. It may also be desirable to deposit a layer of a refractory metal or refractory metal silicide such as tungsten silicide on the layer of polysilicon. Alternatively, a self-aligned silicide ("salicide") process may be performed subsequent to the patterning of the polysilicon layer. The,wiring structure thus formed has a polycide structure and the total thickness of the wiring line is between about 2000–3000 Å. When the layer(s) of wiring material are also used to form the gates of transistors such as FETs, the requirements of such gate electrodes are preferably taken into account in choosing the particular configuration of the wiring layers. Processing of the semiconductor circuit continues by patterning and etching the wiring layers to form wiring lines such as wiring line 50 and a gate electrode 52, as shown in FIG. 10.

Further conventional processing is performed to provide source and drain regions on either side of the gate electrode 52, typically by providing a light implantation dose, forming oxide spacers on either side of the gate electrode, covering the MOS transistors with insulating material, providing the other devices which constitute the desired integrated circuit and forming the contacts and interconnects necessary to complete the semiconductor circuit. For example, if the partial circuit illustrated in FIG. 10 is formed into a DRAM memory cell, additional structures including a charge storage capacitor and bit lines are provided. In such a DRAM memory cell, the wiring line 50 might be connected to the gate electrode of another MOS transistor not illustrated in FIG. 10. Because of the methods used in forming the trench isolation region, there is a reduced likelihood that an unreliable oxide layer will exist where the wiring line 50 passes over the edge of the substrate adjacent the trench. Thus, the performance of the MOS transistor connected to wiring line 50 will less likely be impaired by the action of a parasitic MOS transistor or other form of undesired electrical coupling between the wiring line 50 and the substrate adjacent the trench.

By forming a shallow trench isolation in accordance with the present invention as described above, there is a much lower chance that an etching operation will reduce the level of the insulating plug below the surface of the substrate. Accordingly, a gate oxide layer formed adjacent the trench will be of higher quality than might otherwise occur.

While the present invention has been described with particular emphasis on certain preferred embodiments of the present invention, the present invention is not limited to the particular embodiments described herein. Rather, the scope of the present invention is to be determined by the following claims.

What is claimed is:

1. A method of forming an integrated circuit device including shallow trench isolation structures, the method comprising the steps of:

providing a substrate having a trench extending into a surface of the substrate, the trench having upper edges at the surface of the substrate;

providing a polish stop layer over the substrate, the polish stop layer having an opening corresponding to the upper edges of the trench in the substrate;

providing a layer of trench fill material over the polish stop layer to a sufficient thickness to fill the trench in the substrate, the layer of trench fill material having a first polishing rate; and polishing to remove the layer of trench fill material from over the polish stop layer and to define a plug filling the trench, wherein the polish stop layer has an upper surface and a lower surface, the upper surface has a second polishing rate, and the lower surface has a third polishing rate, wherein a first difference between the second polishing rate and the first polishing rate is smaller than a second difference between the third polishing rate and the first polishing rate.

2. The method of claim 1, wherein the polish stop layer comprises an upper layer of silicon oxynitride and a lower layer of silicon nitride.

3. The method of claim 2, wherein the silicon oxynitride has a refractive index of between about 1.8–2.0 as measured by an optical measurement.

4. The method of claim 1, wherein the polish stop layer has an upper layer and a lower layer with the upper layer being characterized by a first polishing rate for a trench fill material polishing process and the lower layer being characterized by a second polishing rate for a trench fill material polishing process, the first polishing rate being greater than the second polishing rate.

5. The method of claim 4, wherein the opening in the polish stop layer is formed in a continuous dry etching process.

6. The method of claim 4, further comprising the step of removing the upper layer and the lower layer in a single process step.

7. The method of claim 6, wherein the step of removing is a wet etching process.

8. The method of claim 7, wherein the step of removing is accomplished using a heated solution comprising phosphoric acid.

9. The method of claim 1, wherein a polishing rate of the polish stop layer varies over a thickness of the polish stop layer between the upper surface and the lower surface.

10. The method of claim 9, wherein the polishing rate of the polish stop layer exhibits a gradation of polishing rate between the second polishing rate and the third polishing rate over the thickness of the polish stop layer.

11. A method of forming an integrated circuit device including shallow trench isolation structures, the method comprising the steps of:

providing a substrate having a trench extending into a surface of the substrate, the trench having upper edges at the surface of the substrate;

providing a polish stop layer over the substrate, the polish stop layer having an opening corresponding to the upper edges of the trench in the substrate;

providing a layer of trench fill material over the polish stop layer to a sufficient thickness to fill the trench in the substrate, the trench fill material comprising silicon oxide; and polishing the layer of trench fill material to define a plug filling the trench, wherein the polish stop layer comprises an oxynitride surface layer and a lower layer, the oxynitride surface layer having an oxynitride polishing rate and the lower layer having a slower polishing rate in an oxide polishing process.

12. The method of claim 11 wherein the oxynitride layer is characterized by a refractive index of between about 1.8–2.0 as measured by an optical measurement.

13. The method of claim 11, wherein the lower layer comprises silicon nitride.

14. The method of claim 13, wherein the oxynitride layer is characterized by a refractive index of between about 1.8–2.0 as measured by an optical measurement.

15. The method of claim 14, wherein the silicon nitride layer is characterized by a refractive index of about 2.1.

16. A method of forming a shallow trench isolation structures, the method comprising the steps of:

providing a substrate having a trench therein;

forming a polish stop layer on the substrate without covering the trench, the polish stop layer having a first polishing rate;

forming a buffer polishing layer on the substrate without covering the trench, the buffer polishing layer having a second polishing rate;

forming a layer of trench fill material over the buffer polishing layer to a sufficient thickness to fill the trench in the substrate, the layer of trench fill material having a third polishing rate; and polishing to remove the layer of trench fill material form over the buffer polishing layer and to define a plug filling the trench, wherein the second polishing rate is lower than the third polishing rate, and the first polishing rate is lower than the second polishing rate.

* * * * *